US012610788B2

(12) United States Patent
Cao

(10) Patent No.: US 12,610,788 B2
(45) Date of Patent: *Apr. 21, 2026

(54) METHOD OF PROCESSING PHOTORESIST LAYER, AND PHOTORESIST LAYER

(71) Applicant: CHANGXIN MEMORY TECHNOLOGIES, INC., Hefei City (CN)

(72) Inventor: Kanyu Cao, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 908 days.

This patent is subject to a terminal disclaimer.

(21) Appl. No.: 17/814,241

(22) Filed: Jul. 22, 2022

(65) Prior Publication Data

US 2023/0187207 A1 Jun. 15, 2023

Related U.S. Application Data

(63) Continuation of application No. PCT/CN2022/092000, filed on May 10, 2022.

(30) Foreign Application Priority Data

Dec. 13, 2021 (CN) .......................... 202111515342.3

(51) Int. Cl.
*G03F 7/00* (2006.01)
*G03F 7/42* (2006.01)
(Continued)

(52) U.S. Cl.
CPC ........ *H10P 76/2041* (2026.01); *G03F 7/0002* (2013.01); *G03F 7/42* (2013.01); *G03F 7/70* (2013.01); *H10P 14/68* (2026.01)

(58) Field of Classification Search
CPC ... G03F 7/11; G03F 7/095; G03F 7/09; G03F 7/091

See application file for complete search history.

(56) References Cited

U.S. PATENT DOCUMENTS 7,727,709 B2 6/2010 Suganaga et al.
7,799,514 B1 9/2010 Subramanian et al.
(Continued)

FOREIGN PATENT DOCUMENTS

CN 1375745 A 10/2002
CN 1472599 A 2/2004
(Continued)

OTHER PUBLICATIONS

International Search Report cited in PCT/CN2022/092000 mailed Sep. 16, 2022, 10 pages.

*Primary Examiner* — Daborah Chacko-Davis
(74) *Attorney, Agent, or Firm* — Syncoda LLC; Feng Ma

(57) ABSTRACT

The present disclosure relates to the technical field of semiconductors, and provides a method of processing a photoresist layer, and a photoresist layer. The method of processing a photoresist layer includes: forming a photoresist layer on a target layer, where the photoresist layer includes a first part close to the target layer and a second part away from the target layer; performing first exposure processing on the photoresist layer, and forming an exposure image in the first part of the photoresist layer; processing the second part of the photoresist layer by using a first process, such that the second part forms a third part, where a photosensitivity of the third part is higher than that of the first part; and stripping the third part.

20 Claims, 7 Drawing Sheets

(51) Int. Cl.
    *H10P 14/68*       (2026.01)
    *H10P 76/20*       (2026.01)

(56)           References Cited

U.S. PATENT DOCUMENTS

| | | | |
|---|---|---|---|
| 12,386,266 B2 * | 8/2025 | Cao | G03F 7/168 |
| 2015/0241783 A1 * | 8/2015 | Carcasi | G03F 7/2002 |
| | | | 430/324 |
| 2018/0151351 A1 | 5/2018 | Lilin et al. | |
| 2021/0200092 A1 * | 7/2021 | Su | G03F 7/11 |

FOREIGN PATENT DOCUMENTS

| | | |
|---|---|---|
| CN | 101013265 A | 8/2007 |
| JP | H06110214 A | 4/1994 |
| JP | H11153867 A | 6/1999 |
| JP | 2000267298 A | 9/2000 |
| TW | I621921 B | 4/2018 |

* cited by examiner

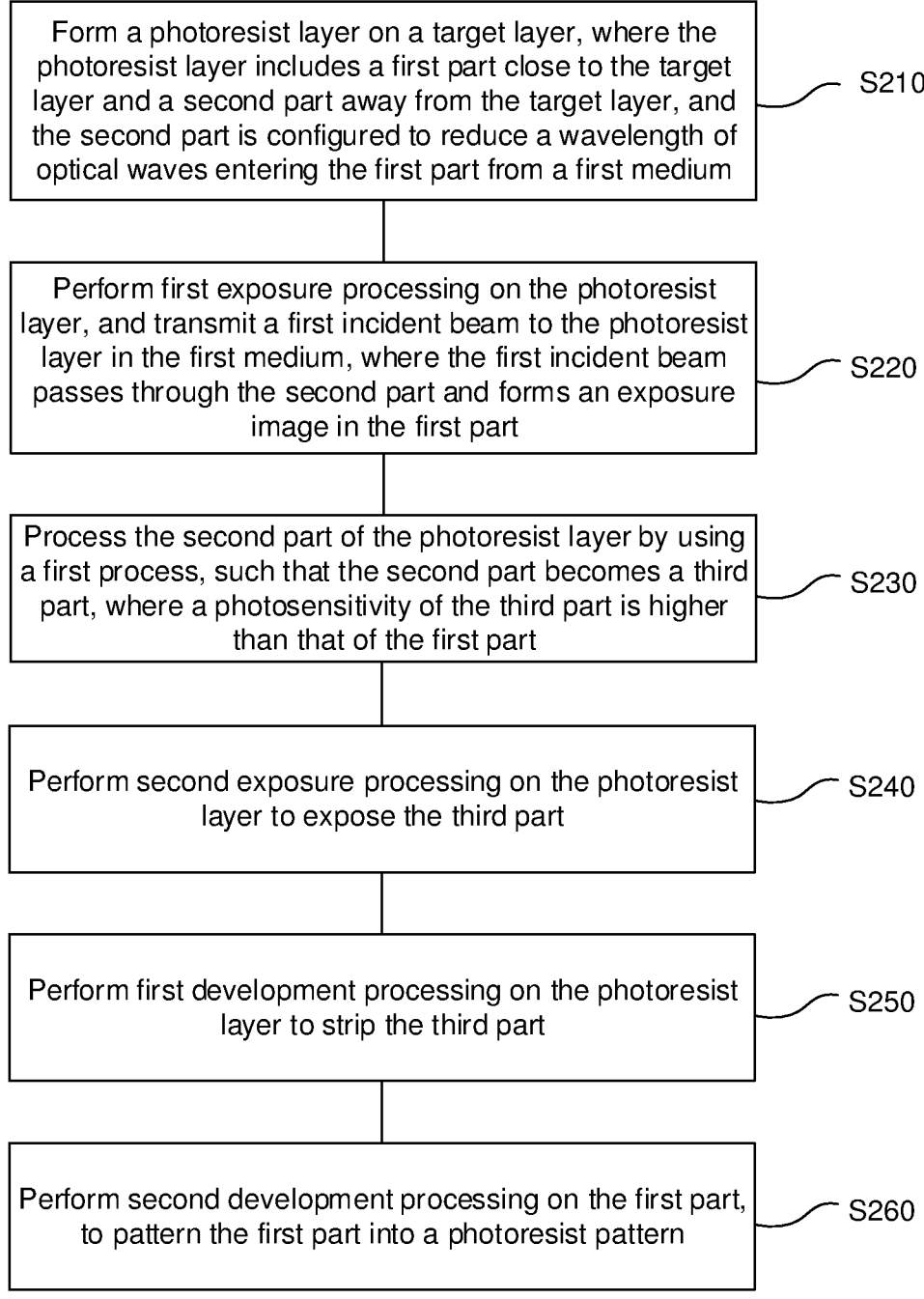

Form a photoresist layer on a target layer, where the photoresist layer includes a first part close to the target layer and a second part away from the target layer, and the second part is configured to reduce a wavelength of optical waves entering the first part from a first medium — S210

Perform first exposure processing on the photoresist layer, and transmit a first incident beam to the photoresist layer in the first medium, where the first incident beam passes through the second part and forms an exposure image in the first part — S220

Process the second part of the photoresist layer by using a first process, such that the second part becomes a third part, where a photosensitivity of the third part is higher than that of the first part — S230

Perform second exposure processing on the photoresist layer to expose the third part — S240

Perform first development processing on the photoresist layer to strip the third part — S250

Perform second development processing on the first part, to pattern the first part into a photoresist pattern — S260

FIG. 2

METHOD OF PROCESSING PHOTORESIST LAYER, AND PHOTORESIST LAYER

CROSS-REFERENCE TO RELATED APPLICATIONS

This is a continuation of International Application No. PCT/CN2022/092000, filed on May 10, 2022, which is based on and claims the priority to Chinese Patent Application No. 202111515342.3, titled "METHOD OF PROCESSING PHOTORESIST LAYER, AND PHOTORESIST LAYER" and filed on Dec. 13, 2021. The entire contents of International Application No. PCT/CN2022/092000 and Chinese Patent Application No. 202111515342.3 are incorporated herein by reference.

TECHNICAL FIELD

The present disclosure relates to, but is not limited to, a method of processing a photoresist layer, and a photoresist layer.

BACKGROUND

As one of the most important process steps in the manufacturing of integrated circuits (ICs), the photolithography process is used to form a desired pattern on a semiconductor substrate. With the development of the IC process and the shrinking of critical dimensions of semiconductor components, the photolithography process is required to have higher precision.

SUMMARY

An overview of the subject matter detailed in the present disclosure is provided below, which is not intended to limit the protection scope of the claims.

The present disclosure provides a method of processing a photoresist layer, and a photoresist layer.

According to a first aspect, the present disclosure provides a method of processing a photoresist layer. The method includes:

forming a photoresist layer on a target layer, where the photoresist layer includes a first part close to the target layer and a second part away from the target layer;

performing first exposure processing on the photoresist layer, and forming an exposure image in the first part of the photoresist layer;

processing the second part of the photoresist layer by using a first process, such that the second part becomes a third part, where a photosensitivity of the third part is higher than a photosensitivity of the first part; and stripping the third part.

According to a second aspect, the present disclosure provides a photoresist layer covering a target layer, where the photoresist layer includes a first part close to the target layer and a third part away from the target layer, and a photosensitivity of the third part is higher than a photosensitivity of the first part; and the third part is obtained by processing a second part away from the target layer through a first process.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

FIG. 2 is a flowchart of a method of processing a photoresist layer according to an exemplary embodiment.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
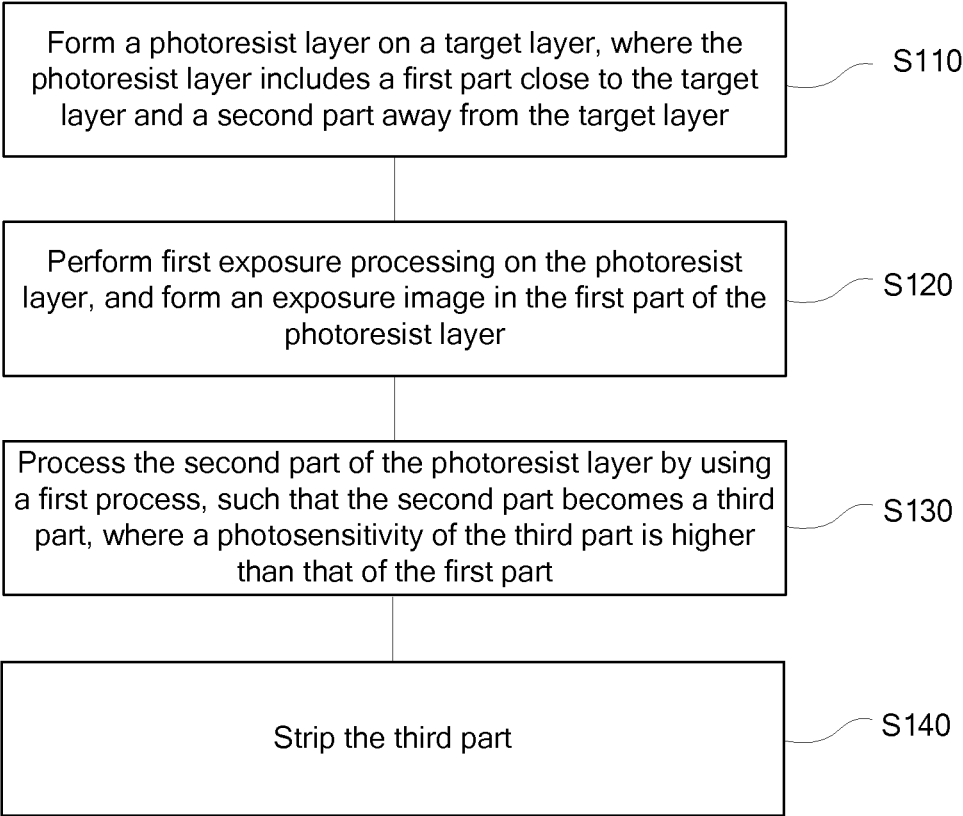
FIG. 1 is a flowchart of a method of processing a photoresist layer according to an exemplary embodiment.

An exemplary embodiment of the present disclosure provides a method of processing a photoresist layer, as shown in FIG. 1. FIG. 1 is a flowchart of a method of processing a photoresist layer according to an exemplary embodiment of the present disclosure. FIG. 4 to FIG. 13 are schematic diagrams of various stages of the method of processing a photoresist layer. The method of processing a photoresist layer is described below with reference to FIG. 4 to FIG. 13.

As shown in FIG. 1, an exemplary embodiment of the present disclosure provides a method of processing a photoresist layer. The method includes:

Step S110: Form a photoresist layer on a target layer, where the photoresist layer includes a first part close to the target layer and a second part away from the target layer.

The target layer 2 refers to a to-be-etched material layer that needs to be patterned. The target layer 2 may be a semiconductor substrate or a semiconductor material layer for forming semiconductor elements, for example, a dielectric layer or a metal layer. A material of the semiconductor substrate may be silicon (Si), germanium (Ge), silicongermanium (GeSi), or silicon carbide (SiC); or may be silicon on insulator (SOI) or germanium on insulator (GOI); or may be another material such as gallium arsenide or other III-V compounds. The semiconductor substrate may be doped with certain impurity ions as required, and the impurity ions may be N-type impurity ions or p-type impurity ions. The semiconductor material layer may be an amorphous carbon layer, an oxide layer, a nitride layer, a copper layer, a tungsten layer, an aluminum layer, or the like, but is not limited thereto.

Figure 4:
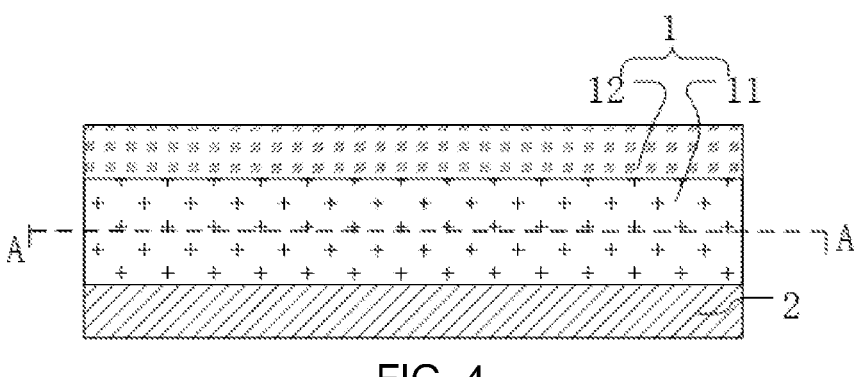
FIG. 4 is a schematic diagram of a photoresist layer according to an exemplary embodiment.

Referring to FIG. 4, the forming a photoresist layer 1 includes: coating the target layer 2 with a photoresist solution, where the photoresist solution includes a photo-acid generator (PAG), a polymer resin, and an organic solvent. The target layer 2 is coated with the photoresist solution through pre-baking (that is, soft baking). A part of the photoresist solution escapes under heat, and the content of the organic solvent of the photoresist solution is reduced, thus forming the photoresist layer 1. The photoresist layer 1 includes a first part 11 close to the target layer 2 and the second part 12 away from the target layer 2.

In some embodiments, during pre-baking, the target layer 2 coated with the photoresist solution may be baked in an environment at a temperature of 80° C. to 110° C. is for 50 seconds to 80 seconds.

Step S120: Perform first exposure processing on the photoresist layer, and form an exposure image in the first part of the photoresist layer.

Figure 5:
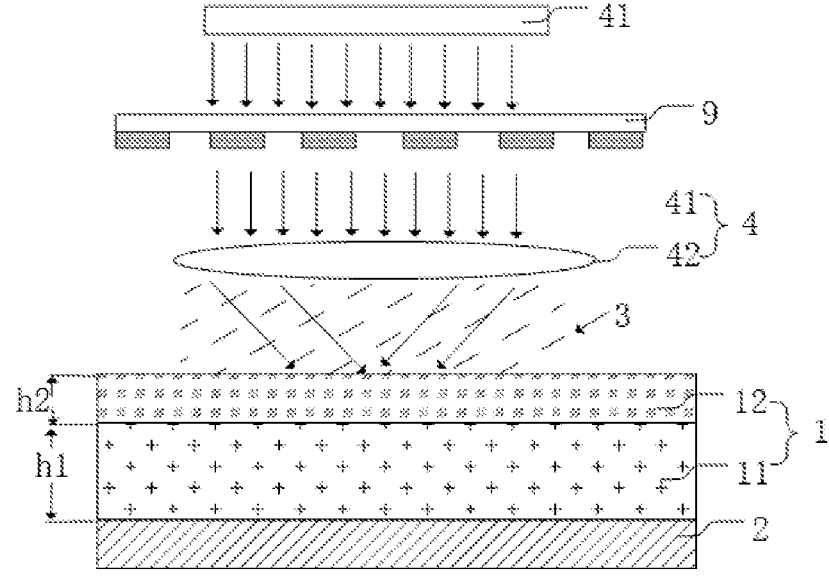
FIG. 5 is a schematic diagram of exposure processing performed by an exposure apparatus on a photoresist layer according to an exemplary embodiment.
Figure 8:
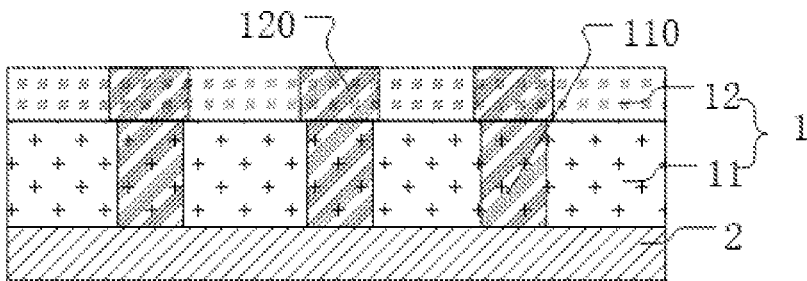
FIG. 8 is a schematic diagram of forming an exposure image in a first part according to an exemplary embodiment.

As shown in FIG. 5 and FIG. 8, an incident beam is transmitted to the photoresist layer 1. The incident beam enters the photoresist layer 1. The incident beam passes through the second part 12 to form an exposure image 110 in the first part 11.

Step S130: Process the second part of the photoresist layer by using a first process, such that the second part becomes a third part, where a photosensitivity of the third part is higher than that of the first part.

Figure 9:
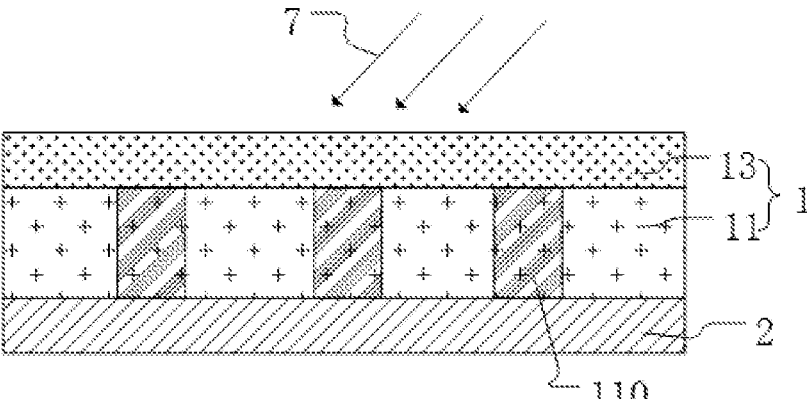
FIG. 9 is a schematic diagram of forming a third part from a second part according to an exemplary embodiment.
Figure 13:
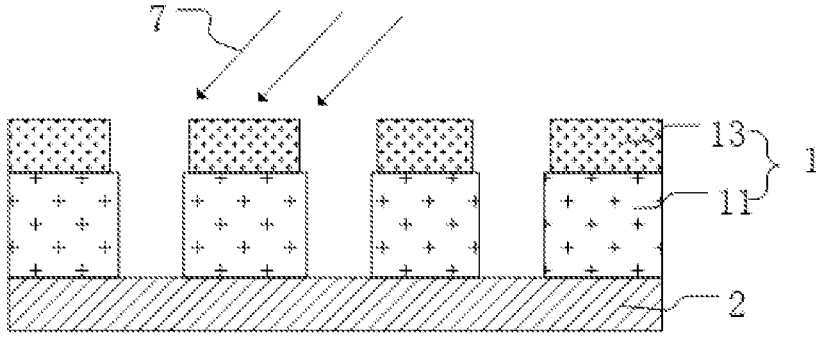
FIG. 13 is a schematic diagram of forming a third part from a second part of a photoresist layer according to an exemplary embodiment.

As shown in FIG. 9 or FIG. 13, the first process is used to improve the concentration of the photo-acid generator in the second part 12 or the concentration of other photosensitive components. The second part 12 is processed in the first process and becomes the third part 13, such that the third part 13 can be quickly and conveniently removed through a photochemical reaction subsequently.

In some embodiments, the sequence of the steps is not restricted. For example, after the first exposure processing is performed on the photoresist layer 1, the second part 12 of the photoresist layer 1 is processed by using the first process; alternatively, after the second part 12 of the photoresist layer 1 is processed by using the first process, the first exposure processing is performed on the photoresist layer 1.

Step S140: Strip the third part.

Figure 10:
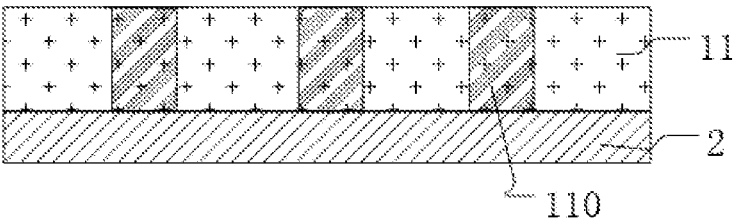
FIG. 10 is a schematic diagram of stripping a third part according to an exemplary embodiment.

As shown in FIG. 10, the third part 13 is processed based on the high photosensitivity of the third part 13, such that the entire third part 13 has a photochemical reaction. The dissolution characteristic of the third part 13 is changed, and the entire third part 13 is dissolved and removed, while the first part 11 is retained as a necessary layer for forming a photoresist pattern.

In some embodiments, the first development processing may be directly performed on the processed photoresist layer 1. Based on different solubilities of the third part 13 and the first part 11 in the developing solution, a development time is controlled to remove the third part 13 while retaining the first part 11.

In the method of this embodiment, the first part of the photoresist is used as the necessary layer for forming the photoresist pattern. After the exposure image is formed in the first part, the second part that may affect the lithographic resolution may be converted into the third part. The third part is removed completely, while the first part with high lithographic resolution is retained. The photoresist pattern formed according to the exposure image of the first part has higher dimensional precision, and the shape of the photoresist pattern is better in line with expectations.

As shown in FIG. 2, FIG. 2 is a flowchart of a method of processing a photoresist layer according to an exemplary embodiment. FIG. 4 to FIG. 13 are schematic diagrams of various stages of the method of processing a photoresist layer. The method of processing a photoresist layer is described below with reference to FIG. 4 to FIG. 13.

As shown in FIG. 2, an exemplary embodiment of the present disclosure provides a method of processing a photoresist layer. The method includes:

Step S210: Form a photoresist layer on a target layer, where the photoresist layer includes a first part close to the target layer and a second part away from the target layer, and the second part is configured to reduce a wavelength of optical waves entering the first part from a first medium.

Figure 6:
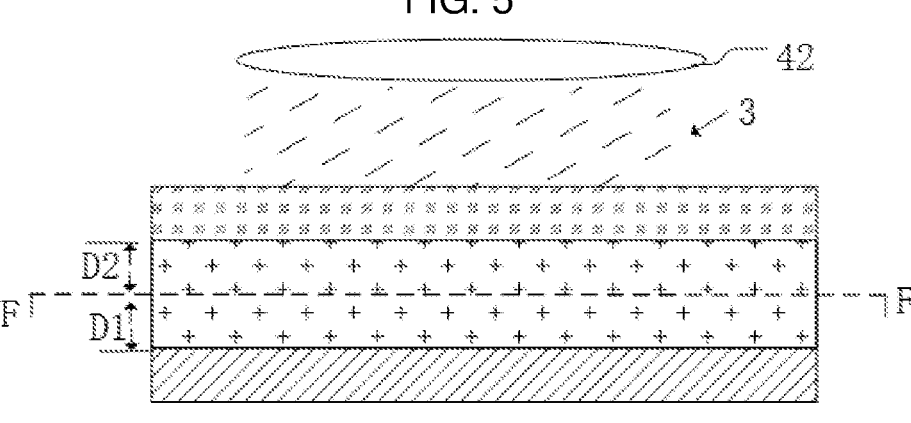
FIG. 6 is a schematic diagram of a focal plane of the exposure apparatus shown in FIG. 5.
Figure 7:
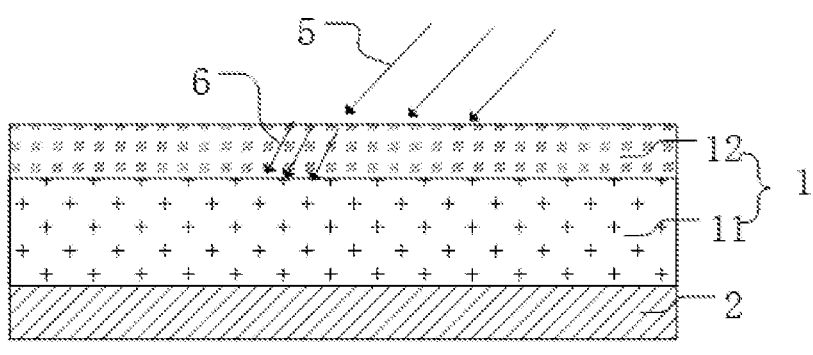
FIG. 7 is a schematic diagram of first exposure processing for a photoresist layer according to an exemplary embodiment.

As shown in FIG. 5 to FIG. 7, the optical waves from the first medium 3 enters the first part 11 through the second part 12. In the photoresist layer 1 in this embodiment, a refractive index $n2$ of the second part 12 is greater than a refractive index $n1$ of the first medium 3 and less than a refractive index $n3$ of the first part 11. In the photoresist layer 1 of this embodiment, a propagation medium layer with an increasing refractive index is formed along an incidence path of the incident beam.

The photoresist layer 1 in this embodiment is a positive photoresist layer. The positive photoresist layer does not dissolve in the developing solution before having a photochemical reaction under light exposure. The dissolution characteristic of the positive photoresist layer is changed after the photochemical reaction, such that the positive photoresist layer can dissolve in the developing solution.

In some embodiments, the photoresist layer 1 mainly includes a photo-acid generator (PAG), a polymer resin, and a solvent. The photo-acid generator decomposes under light to generate acid. The H+ ions of the acid can serve as a catalyst to facilitate falling off of is unstable groups of the polymer resin. As the unstable groups fall off, the polarity of the polymer resin changes, and after a sufficient number of pendant groups fall off from the polymer resin, the photoresist can dissolve in the developing solution, to be removed by the developing solution.

Step S220: Perform first exposure processing on the photoresist layer, and transmit a first incident beam to the photoresist layer in the first medium, where the first incident beam passes through the second part and forms an exposure image in the first part.

As shown in FIG. 5 and FIG. 7, during the first exposure processing of the photoresist layer 1, the photoresist layer 1 is placed in the first medium 3, and a first incident beam 5 is transmitted from the first medium 3 to the photoresist layer 1. The first incident beam 5 has a first wavelength $\lambda 1$. The first incident beam 5 is refracted by the second part 12 and becomes a second incident beam 6 having a second wavelength $\lambda 2$. The second wavelength is less than the first wavelength, that is, $\lambda 2 < \lambda 1$. The second incident beam 6 enters the first part 11, and forms an exposure image 110 in the first part 11.

In the lithography process, lithographic resolution affects the quality of the exposure image. With higher lithographic resolution, the formed exposure image has higher precision. The lithographic resolution follows the Rayleigh formula:

$$R = k_1 \frac{\lambda}{NA}$$

where R is a lithographic resolution; k1 is a process constant; $\lambda$ is an exposure wavelength; NA is a numerical aperture (NA) of a projection lens for emitting the incident beam.

The lithographic resolution is used for representing a minimum achievable line width in the lithography process. According to the Rayleigh formula, a smaller wavelength of the incident optical wave and a smaller process constant can result in a smaller line width, that is, higher lithographic precision. In some embodiments, a refractive index n2 of the second part 12 is greater than a refractive index n1 of the first medium 3. When the first incident beam 5 enters the second part 12 from the first medium 3, the propagation medium changes. The light travels in two propagation medium layers having different refractive indexes, and the relationship between optical waves and refractive indexes is as follows:

$$\lambda 2 = \frac{\lambda 1 \times n1}{n2}.$$

In some embodiments, the first incident beam 5 enters the second part 12 with a larger refractive index from the first medium 3 with a smaller refractive index; the first incident beam 5 has a smaller wavelength and becomes the second incident beam 6, and the exposure image formed by the second incident beam 6 in the first part 12 of the photoresist layer 1 has higher precision.

In some embodiments, a thickness h2 of the second part 12 is greater than $1/10$ of the first wavelength $\lambda 1$ of the first incident beam 5, such that the first incident beam 5 can be refracted by the second part 12 when passing through the second part 12.

In some embodiments, as shown in FIG. 8, during the first exposure processing of the photoresist layer 1, the second part 12 is also exposed to form a second exposure region 120. As the first incident beam 5 is refracted when passing through the second part 12 and the wavelength of the first incident beam 5 changes, the second exposure region 120 has poor size and shape uniformity.

Step S230: Process the second part of the photoresist layer by using a first process, such that the second part becomes a third part, where a photosensitivity of the third part is higher than that of the first part.

In some embodiments, as shown in FIG. 8 and FIG. 9, the processing the second part 12 of the photoresist layer 1 by using a first process includes: implanting hydrogen ions from a top surface of the photoresist layer 1 into the photoresist layer 1, where an implantation depth of the hydrogen ions is a first depth, and the first depth is equal to the thickness h2 of the second part 12; after hydrogen ions are implanted into the second part 12, the second part 12 becomes the third part 13, where the third part 13 has a higher concentration of hydrogen ions ($H^+$) than the first part 11. In other embodiments, the first depth of implantation of hydrogen ions into the photoresist layer 1 from the top surface of the photoresist layer 1 may also be greater than the thickness h2 of the second part 12.

In some embodiments, the implantation of $H^+$ ions makes the concentration of $H^+$ ions in the formed third part 13 much higher than the concentration $H^+$ ions in the first part 11. The solubility of the third part 13 in the developing solution is much higher than that of the first part 11 in the developing solution. The $H^+$ ions of the acid can serve as a catalyst to facilitate falling off of unstable groups of the polymer resin in the third part 13. As the unstable groups fall off, the polarity of the polymer resin changes, and after a sufficient number of pendant groups fall off from the polymer resin, the third part 13 can dissolve in the developing solution, to be removed by the developing solution. The concentration of $H^+$ ions is positively correlated with the degree of polarity change of the polymer resin. Therefore, the dissolution characteristic of the third part 13 changes after the photochemical reaction, and based on different dissolution characteristics of the third part 13 and the first part 11, the entire third part 13 can be removed from the first part 11 by using the developing solution.

For example, after implantation of $H^+$ ions, the $H^+$ concentration of the third part 13 is 2 times that of the first part 11 or higher. For example, the $H^+$ concentration of the third part 13 may be 2 times, 2.5 times, or 3 times that of the first part 11.

In some embodiments, after the first process, the third part 13 has a high $H^+$ concentration. In the post-baking process, the highly concentrated $H^+$ ions act on the polymer resin, to cause unstable groups to fall off from the polymer resin in the third part 13 quickly, thus reducing the time for changing the polarity of the polymer resin and the time for changing the dissolution characteristic of the third part 13.

In some embodiments, a metal oxide or light absorbing groups may be added to the second part 12 to improve the photosensitivity of the third part 13 after conversion. By improving the photosensitivity, i.e., light sensitivity, of the third part 13, uneven development caused by uneven distribution of the photo-acid generator has less impact on the resolution of the first part 11, so as to improve the lithographic resolution of the first part 11.

Step S240: Perform second exposure processing on the photoresist layer to expose the third part.

The second exposure processing includes: as shown in FIG. 9, transmitting a third incident beam 7 to the photoresist layer 1, and the third incident beam 7 radiates the surface of the third part 13, such that the entire third part 13 is exposed by the third is incident beam 7; the third part 13 has a photochemical reaction with the third incident beam 7, which changes the dissolution characteristic of the third part 13, and the third part 13 is soluble in the developing solution, to be conveniently stripped in the subsequent step.

In some embodiments, the intensity of the third incident beam 7 is higher than that of the first incident beam 5, and the second exposure processing lasts a shorter period of time than the first exposure processing, to ensure the third part 13 to be completely exposed by the third incident beam 7, while the first part 11 is not affected by the third incident beam 7, thus ensuring the integrity of the formed photoresist pattern.

Step S250: Perform first development processing on the photoresist layer to strip the third part.

The performing first development processing on the photoresist layer 1 includes: as shown in FIG. 10 with reference to FIG. 9, spraying a first developing solution to the photoresist layer 1, such that the first developing solution is distributed all over the third part 13; the third part 13 is fully submerged in the first developing solution and dissolves in the first developing solution. The first developing solution in which the third part 13 is dissolved and the excess first developing solution is cleaned, the third part 13 is removed, and the first part 11 is retained intact.

Step S260: Perform second development processing on the first part, to pattern the first part into a photoresist pattern.

Figure 11:
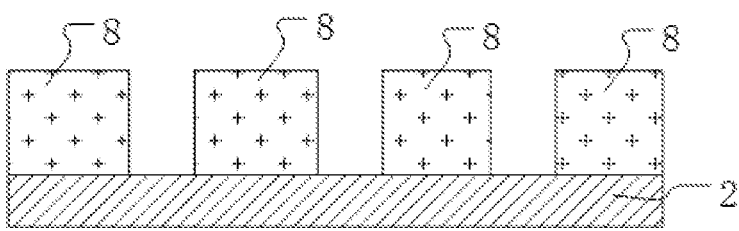
FIG. 11 is a schematic diagram of second development processing for a first part according to an exemplary embodiment.

The performing second development processing on the first part 11 includes: as shown in FIG. 11 with reference to FIG. 10, spraying a second developing solution to the first part 11, such that the second developing solution is distributed all over the first part 11; the first part 11 is fully submerged in the second developing solution, and a region of the exposure image 110 in the first part 11 dissolves in the second developing solution.

After the second development processing for the first part 11, deionized water may be sprayed to the first part 11 to clean the first part 11; the second developing solution in which the first part 11 is dissolved and the excess second developing solution are removed, and the first part 11 not dissolved in the second developing solution forms the photoresist pattern 8.

In some embodiments, the concentration of the first developing solution used in the first development processing is lower than the concentration of the second developing solution used in the second development processing.

In some embodiments, after the second development processing for the first part 11, the first part 11 is post-baked. For example, hard baking is performed on the retained first part 11 at a temperature of 130° C. to 200° C. for 20 to 40 minutes, such that the solvent in the first part 11 completely escapes, and the polymer components in first part 11 are further polymerized, thus enhancing the etching resistance of the formed photoresist pattern 8.

In the method of processing a photoresist layer of this embodiment, the first part of the photoresist layer is used as a necessary layer for forming the photoresist pattern and the second part is used as a functional layer. The second part is configured to refract the incident beam to reduce the wavelength of optical waves entering the first part. The lithographic resolution of the exposure image formed on the first part is improved by using the refractive properties of the second part, such that the exposure image formed on the first part has higher precision. The method of processing a photoresist layer of this embodiment can be used in an exposure process with a smaller lithographic critical dimension and more complex and diverse structures.

In the method of processing a photoresist layer of this embodiment, the photoresist layer is exposed twice and developed twice, such that after the wavelength of the incident optical waves is reduced by the second part, the second part is processed and thus becomes the third part with a higher photosensitivity. Based on the high photosensitivity of the third part, low-light-intensity and short-time second exposure processing is performed on the third part, to expose the entire third part, while the first part is not affected by the second exposure processing, such that the third part can dissolve in the developing solution. The third part is removed by the low-concentration developing solution, ensuring that the first part is retained intact.

Figure 12:
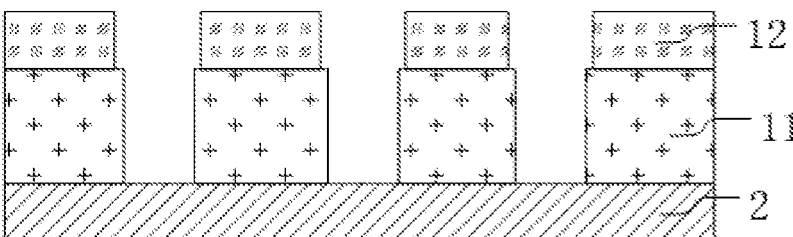
FIG. 12 is a schematic diagram of first development processing for a first part and a second part of a photoresist layer according to an exemplary embodiment.

In other embodiments, as shown in FIG. 12 with reference to FIG. 8, after the first exposure processing, first development processing may be performed on the first part 11 and the second part 12 first, and then exposed parts in the first part 11 and the second is part 12 are removed through first development processing. As shown in FIG. 13 with reference to FIG. 12, the retained second part 12 is processed through the first process, such that the second part 12 becomes the third part 13 with a high photosensitivity; then, the third part 13 is removed through the second exposure processing and the second development processing, and the retained first part 11 forms the photoresist pattern 8 (referring to FIG. 11).

According to an exemplary embodiment, this embodiment is a description of the implementation of step S220 in the foregoing embodiment. During the implementation process, the first exposure processing is performed in an exposure apparatus, and the performing first exposure processing on the photoresist layer further includes: adjusting the exposure apparatus, such that a focal plane for imaging of the exposure apparatus is located in the first part.

As shown in FIG. 5 and FIG. 7, the first incident beam 5 emitted by the exposure apparatus 4 passes through the second part 12, to reduce the wavelength from $\lambda 1$ to $\lambda 2$. Therefore, as shown in FIG. 6, before the first exposure processing is performed on the photoresist layer 1, the focal plane F-F for imaging of the exposure apparatus 4 is adjusted in advance, so as to be located in the first part 11, to ensure that the exposure image 110 is formed in the first part 11.

In some embodiments, as shown in FIG. 6 and FIG. 7, the adjusting the exposure apparatus 4 includes: adjusting the focal plane F-F for imaging of the exposure apparatus 4 by comprehensively considering the obtained refractive index n1 of the first medium, refractive index n2 of the second part, refractive index n3 of the first part, thickness h1 of the first part, and thickness h2 of the second part.

According to an exemplary embodiment, with reference to FIG. 4 and FIG. 6, the focal plane F-F for imaging of the exposure apparatus 4 is formed in a plane in which a central line A-A of the first part 11 is located, and the first part 11 is located between a front focal depth D1 and a back focal depth D2 for imaging of the exposure apparatus 4.

In this embodiment, the focal plane F-F for imaging of the exposure apparatus 4 is formed in a plane in which the central line A-A of the first part is located, to ensure that the exposure image formed in the first part is clearer and the formed photoresist pattern has higher dimensional precision.

A region between the front focal depth and the back focal depth for imaging of the exposure apparatus is an exposure region. The first part is located between the front focal depth and the back focal depth for imaging of the exposure apparatus. That is, along a thickness direction of the photoresist layer, the first part is located in the exposure region, to ensure that all regions from the top surface to the bottom surface of the first part can be exposed, avoiding the problem that the photoresist pattern is incomplete because the exposure image is not formed in a partial region of the first part.

According to an exemplary embodiment, referring to FIG. 4 and FIG. 6, the front focal depth D1 for imaging of the exposure apparatus 4 is half of the thickness h1 of the first part 11, that is, the front focal depth D1 for imaging of the exposure apparatus 4 is h½. Referring to FIG. 11, the back focal depth D2 for imaging of the exposure apparatus 4 is h½, such that the exposure image 100 can be formed over the entire thickness of the first part 11 through exposure. In some embodiments, the thickness h1 of the first part 11 is the region along which the exposure image 110 is formed. The entire exposure image 110 is formed in the first part 11, which reduces the waste of the exposure beam and improves the light utilization.

According to an exemplary embodiment, the method of processing a photoresist layer according to this embodiment further includes: providing a mask plate 9, where a mask pattern is formed on the mask plate 9, and performing first exposure processing on the photoresist layer 1 based on the mask plate 9.

As shown in FIG. 5, the exposure apparatus 4 includes an exposure light source 41 and a projection lens 42. The mask plate 9 is disposed between the exposure light source 41 and the projection lens 42. The photoresist layer 1 is disposed under the projection lens 42 of the exposure apparatus 4, and the exposure apparatus 4 is adjusted such that the projection lens 42 is aligned with the photoresist layer 1.

A first medium 3 exists between the projection lens 42 and the photoresist layer 1, where the first medium 3 is gas or liquid. When the first medium 3 is liquid, the projection lens 42 and the photoresist layer 1 are submerged in the first medium 3. For example, the first medium 3 may be air or water.

Through the photoresist processing method of this embodiment, a high-resolution pattern with a clear contour can be formed in the first part of the photoresist layer according to the mask plate.

Figure 3:
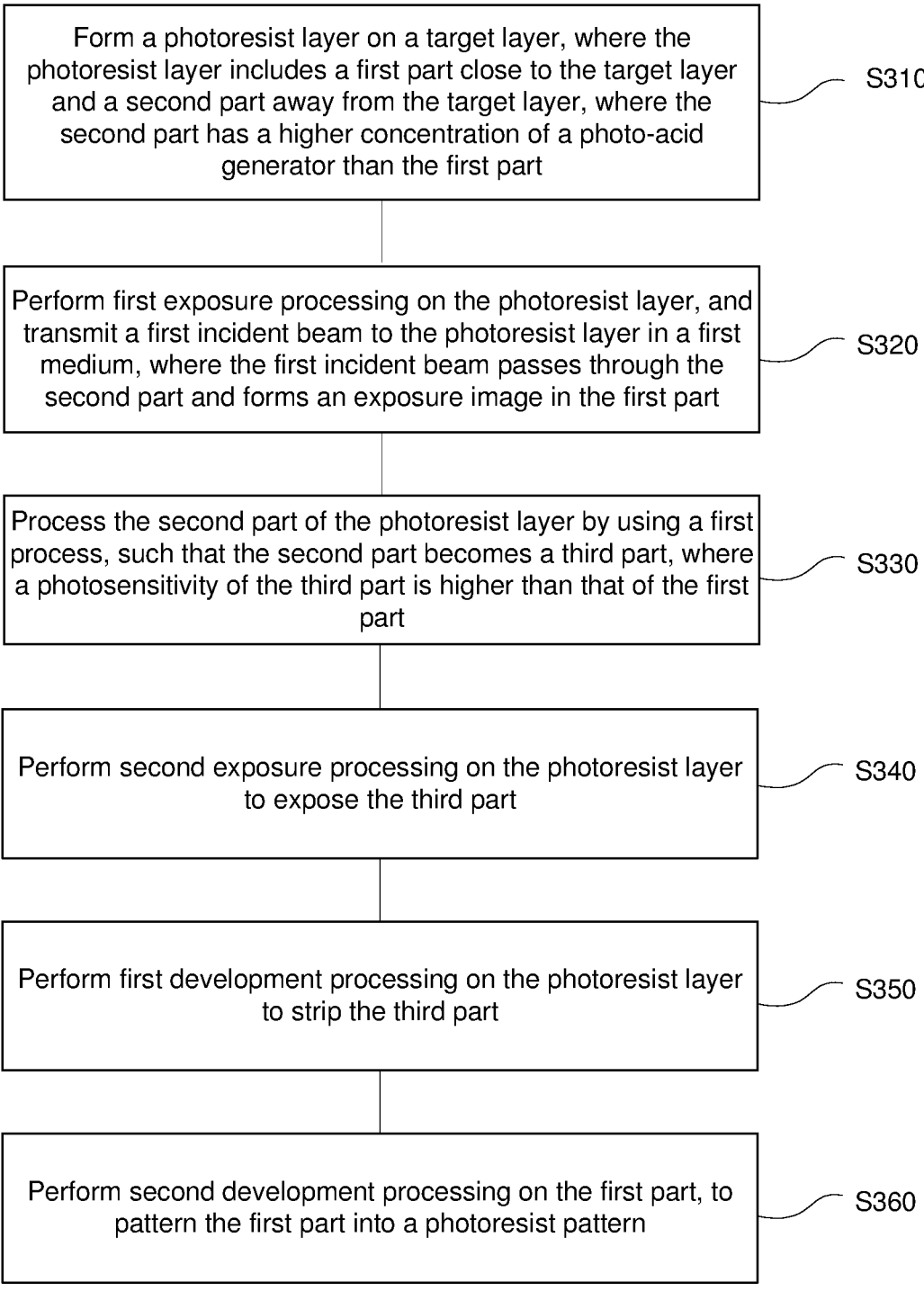
FIG. 3 is a flowchart of a method of processing a photoresist layer according to an exemplary embodiment.

As shown in FIG. 3, FIG. 3 is a flowchart of a method of processing a photoresist layer according to an exemplary embodiment of the present disclosure. FIG. 14 to FIG. 18 are schematic diagrams of various stages of the method of processing a photoresist layer. The method of processing a photoresist layer is described below with reference to FIG. 4 to FIG. 18 in combination with FIG. 5 and FIG. 11.

As shown in FIG. 3, an exemplary embodiment of the present disclosure provides a method of processing a photoresist layer. The method includes:

Step S310: Form a photoresist layer on a target layer, where the photoresist layer includes a first part close to the target layer and a second part away from the target layer, where the second part has a higher concentration of a photo-acid generator than the first part.

Figure 14:
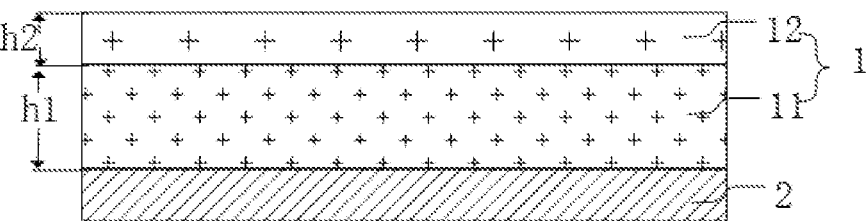
FIG. 14 is a schematic diagram of a photoresist layer according to an exemplary embodiment.

As shown in FIG. 14, the photoresist layer 1 of this embodiment is a positive photoresist layer. The photoresist layer 1 includes a photo-acid generator (PAG), a polymer resin, and a solvent.

The photo-acid generator (PAG) facilitates the polarity change of the polymer resin under light exposure, to change the dissolution characteristic of the photoresist layer. The concentration of the photo-acid generator affects the photosensitivity of the photoresist layer. Higher uniformity of the concentration of the photo-acid generator in the photoresist layer corresponds to higher consistency of the photosensitivity of the photoresist layer and higher lithographic resolution. However, in the semiconductor manufacturing process, affected by the process environment, after the photoresist layer 1 is formed on the target layer 2, a part of the photo-acid generator at the top of the photoresist layer 1 is neutralized by alkaline ions in the process environment (such as amino ions $NH_{2-}$), such that the second part 12 of the photoresist layer 1 has a lower concentration of the photo-acid generator than the first part 11.

Step S320: Perform first exposure processing on the photoresist layer, and transmit a first incident beam to the photoresist layer in a first medium, where the first incident is beam passes through the second part and forms an exposure image in the first part.

Figure 15:
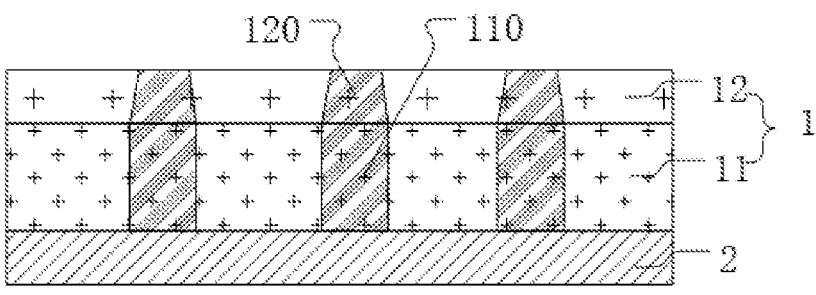
FIG. 15 is a schematic diagram of first exposure processing for a photoresist layer according to an exemplary embodiment.

As shown in FIG. 15 with reference to FIG. 5, an incident beam is transmitted to the photoresist layer 1. The incident beam enters the photoresist layer 1. The incident beam enters the second part 12, and a region irradiated by the incident beam in the second part 12 is exposed to form a second exposure region 120; the incident beam passes through the second part 12 and forms the exposure image 110 in the first part 11.

Because the concentration of the photo-acid generator in the second part 12 is lower, the line width of the second exposure region 120 of the second part 12 is less than the line width of the exposure image 110 of the first part 11. The second part 12 and the photoresist pattern of the first part 11 after exposure and development form a T shape (referring to FIG. 17). The presence of the T shape reduces the lithographic resolution, and results in poor etching resistance of the formed photoresist pattern.

Step S330: Process the second part of the photoresist layer by using a first process, such that the second part becomes a third part, where a photosensitivity of the third part is higher than that of the first part.

Figure 16:
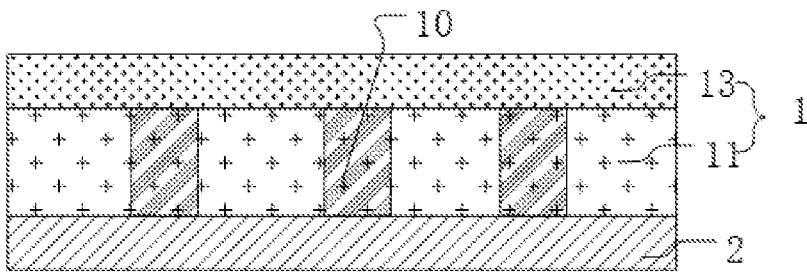
FIG. 16 is a schematic diagram of forming a third part from a second part of a photoresist layer according to an exemplary embodiment.

As shown in FIG. 16 with reference to FIG. 15, an acid gas is sprayed to the top surface of the photoresist layer 1. The acid gas reduces the photo-acid product in the second part 12 to be the photo-acid generator. The second part 12 becomes the third part 13, and the third part 13 has a higher concentration of the photo-acid generator than the first part 11.

In the semiconductor manufacturing process, the photo-acid generator in the photoresist layer 1 is generally oxidized by amino ions in the process environment. The photo-acid product generated by bonding of the photo-acid generator and the amino ions has unstable properties. In some embodiments, the acid gas is sprayed to the top surface of the photoresist layer 1. The acid gas penetrates into the second part 12, and the photo-acid product with unstable properties in the second part 12 is reduced by the acid gas to be the photo-acid generator, such that the second part 12 becomes the third part 13. During light exposure, the time for changing the dissolution characteristic of the third part 13 is less than the time for changing the dissolution characteristic of the first part 11.

Meanwhile, a part of the acid gas sprayed to the top surface of the photoresist layer is will be dissociated into $H^+$, which increases the $H^+$ concentration of the third part 13. Under a certain light exposure condition, the third part 13 can further have a photochemical reaction, to reduce the time for changing the polarity of the polymer resin, such that the dissolution characteristic of the third part 13 changes faster.

In some embodiments, the acid gas sprayed to the top surface of the photoresist layer 1 diffuses to the surrounding environment of the photoresist layer 1, to provide an acid process condition for processing the photoresist layer 1.

Under the acid condition, the photo-acid reactant is more active, such that the photo-acid generator decomposes more easily under light exposure to generate acid, thus improving the catalytic activity of the photo-acid generator and causing unstable groups of the polymer resin to fall off more quickly, which makes it easier to strip the third part 13 from the first part 11 subsequently.

The sprayed acid gas may be a hydrogen chloride (HCL) gas or hydrofluoric acid (HF) gas.

In some embodiments, the photo-acid generator is reduced by using the acid gas, which reduces the process control difficulty and achieves high control precision, such that the processing region of the first process can be precisely controlled within the second part 12, to avoid the first process from affecting the first part 11, and ensure that the first part 11 is retained intact as a necessary layer for forming the photoresist pattern 8. Moreover, in some embodiments, the by-product gas generated by the reaction between the photo-acid product and the acid gas escapes to the process space without contaminating the process environment, thus ensuring the cleanliness of the process environment and preventing the by-product of the reduction reaction from affecting the process.

Step S340: Perform second exposure processing on the photoresist layer to expose the third part.

Step S350: Perform first development processing on the photoresist layer to strip the third part.

Step S360: Perform second development processing on the first part, to pattern the first part into a photoresist pattern.

In this embodiment, steps S340 to S360 of this embodiment are implemented in the same manner as steps S340 to S360 and steps S240 to S260 of the foregoing embodiments, and will not be described in detail again herein.

In the method of processing a photoresist layer according to this embodiment, after the photoresist layer is formed, the second part with a lower concentration of the photo-acid generator is processed by using the first process, such that the second part becomes the third part. The third part has a higher concentration of the photo-acid generator than the first part. The dissolution characteristic of the third part changes within a shorter time after the photochemical reaction than the dissolution characteristic of the first part. By the exposure and development processing for the third part, the T-shaped top end formed at the top of the exposure image during the first exposure processing is removed, while the first part with a uniform concentration of the photo-acid generator is retained to form the photoresist pattern, thereby improving the lithographic resolution.

Figure 17:
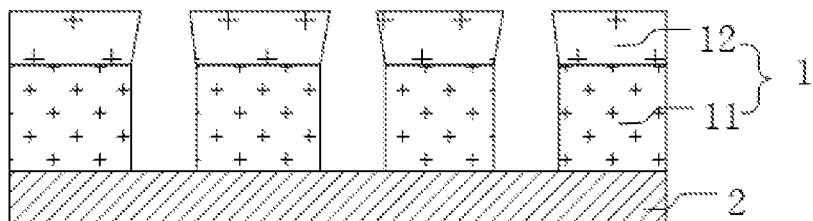
FIG. 17 is a schematic diagram of first development processing for a first part and a second part of a photoresist layer according to an exemplary embodiment.
Figure 18:
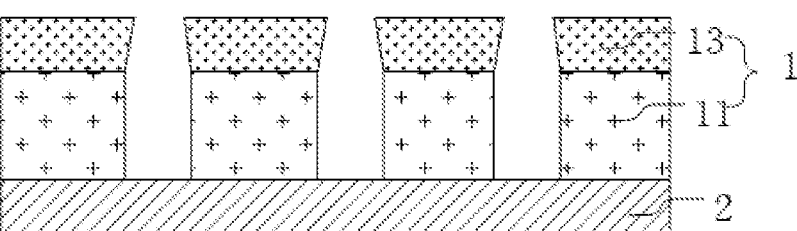
FIG. 18 is a schematic diagram of forming a third part from a second part of a photoresist layer according to an exemplary embodiment.

In other embodiments, as shown in FIG. 17 with reference to FIG. 15, after the first exposure processing, first development processing may be performed on the first part 11 and the second part 12 first, to remove exposed portions in the first part 11 and the second part 12, and the retained second part 12 forms a T shape on the top of the first part 11. As shown in FIG. 18 with reference to FIG. 17, the second part 12 retained after the first process becomes the third part 13 having a photosensitivity. Referring to FIG. 11 and FIG. 18, the third part 13 is then removed through second exposure processing and second development processing, to remove the T-shaped top end, and the photoresist pattern 8 formed by the retained first part 11 has a uniform size and line width.

An exemplary embodiment of the present disclosure provides a photoresist layer. As shown in FIG. 9, the photoresist layer includes a first part 11 close to a target layer 2 and a third part 13 away from the target layer 2, where a photosensitivity of the third part 13 is higher than that of the first part 11, and the third part 13 is obtained by processing a second part 12 away from the target layer 2 through a first process (referring to FIG. 4).

In the photoresist layer of this embodiment, after the second part 12 is processed to become the third part 13, the dissolution characteristic of the third part 13 can be changed by controlling exposure light intensity and an exposure time, to remove the third part 13 from the first part 11.

According to an exemplary embodiment, referring to FIG. 4 and FIG. 6, the second part 12 is configured to reduce a wavelength of optical waves entering the first part 11 from a first medium 3; a refractive index of the second part 12 is greater than a refractive index of the first medium 3 and less than a refractive index of the first part 11. For example, when the first medium 3 is air, the refractive index n2 of the second part 12 is greater than 1; when the first medium 3 is water, the refractive index n2 of the second part 12 is greater than 1.44.

According to an exemplary embodiment, referring to FIG. 4, a thickness of the second part 12 is greater than $\frac{1}{10}$ of a wavelength of an incident beam entering the photoresist layer 1 from the first medium 3. For example, the optical wavelength of the lithography equipment includes, but is not limited to, G-line (436 nm), I-line (365 nm), KrF (248 nm), ArF (193 nm), and extreme ultraviolet (EUV) (13.5 nm). Correspondingly, for example, when KrF lithography equipment is used, the thickness h2 of the second part 12 may be greater than 24.8 nm; when ArF lithography equipment is used, the thickness h2 of the second part 12 is greater than 19.3 nm; when EUV lithography equipment is used, the thickness h2 of the second part 12 may be greater than 1.35 nm.

In some embodiments, the thickness h2 of the second part 12 is less than $\frac{1}{5}$ of a thickness h1 of the first part 11, that is, h2<h1/5, which reduces the difficulty of stripping the third part 13 while ensuring that the thickness of the second part 12 and the thickness of the third part 13 satisfy the etching requirement.

In the photoresist layer of this embodiment, the second part 12 reduces the wavelength of optical waves entering the first part 11, thereby improving the lithographic resolution.

According to an exemplary embodiment, referring to FIG. 9 and FIG. 6, the third part 13 is configured to reduce a wavelength of optical waves entering the first part 11 from the first medium 3; a refractive index of the third part 13 is greater than the refractive index of the first medium 3 and less than the refractive index of the first part 11. For example, when the first medium 3 is air, the refractive index n2' of the third part 13 is greater than 1, and when the first medium 3 is water, the refractive index n2' of the third part 13 is greater than 1.44.

According to an exemplary embodiment, referring to FIG. 9 and FIG. 6, a thickness of the third part 13 is greater than $\frac{1}{10}$ of a wavelength of an incident beam entering the photoresist layer 1 from the first medium 3.

According to an exemplary embodiment, as shown in FIG. 9, the third part 13 of the photoresist layer 1 has a higher concentration of the photo-acid generator than the first part 11.

According to an exemplary embodiment, as shown in FIG. 9, the third part 13 of the photoresist layer 1 has a higher concentration of hydrogen ions than the first part 11. In some embodiments, the $H^+$ concentration of the third part 13 is 2 times that of the first part 11 or higher. For example, the $H^+$ concentration of the third part 13 may be 2 times, 2.5 times, or 3 times that of the first part 11.

According to some embodiments of the present disclosure, as shown in FIG. 9, the photoresist layer 1 is a positive photoresist layer.

In the photoresist layer of this embodiment, the photosensitivity of the third part 13 is higher than that of the first part 11. The dissolution characteristic of the third part 13 can be changed by controlling exposure light intensity and an exposure time, to remove the third part 13 from the first part 11, and reduce the impact of uneven concentration of the photo-acid generator on the exposure of the photoresist layer, such that the exposure image formed in the photoresist layer has a clear contour and a uniform size.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Although the steps in the flowcharts of FIG. 1 to FIG. 3 are sequentially connected, these steps are not necessarily performed in the order of the connection. The execution order of the steps is not strictly limited, and the steps may be executed in other orders, unless clearly described otherwise. Moreover, at least some of the steps in FIG. 1 to FIG. 3 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of processing a photoresist layer and a photoresist layer that are provided by the embodiments of the present disclosure, an exposure image is formed in the first part of the photoresist, and the third part obtained by performing the first process on the second part is removed, to prevent the third part from affecting the lithographic resolution. The retained first part has higher lithographic resolution, and the size and shape of the exposure image formed in the first part are more in line with expectations.

The invention claimed is:

1. A method of processing a photoresist layer, comprising:
   forming a photoresist layer on a target layer, wherein the photoresist layer comprises a first part on the target layer and a second part on the first part, wherein the target layer is a substrate or material layer;
   performing first exposure processing on the photoresist layer, and the first part of the photoresist layer on the target layer having an exposure image;
   processing the second part of the photoresist layer by using a first process, such that the second part becomes a third part, wherein a photosensitivity of the third part is higher than a photosensitivity of the first part;
   performing first development processing to develop the third part to strip the third part on the first part; and
   performing second development processing to develop the first part with the exposure image;
   wherein the performing first exposure processing on the photoresist layer comprises:
   transmitting a first incident beam to the photoresist layer in a first medium, wherein the first incident beam passes through the second part and is refracted by the second part and becomes a second incident beam, and the second incident beam transmits into the first part to form the exposure image in the first part;
   wherein the first incident beam has a first wavelength and the second incident beam has a second wavelength less than the first wavelength, and the first medium is air or water.

2. The method of processing a photoresist layer according to claim 1, further comprising:
   performing second exposure processing on the photoresist layer before the first development processing to expose the third part, wherein a time of the second exposure process is shorter than that of the first exposure processing.

3. The method of processing a photoresist layer according to claim 2, the entire third part is exposed by the second exposure processing without a mask plate.

4. The method of processing a photoresist layer according to claim 1, wherein the processing the second part of the photoresist layer by using a first process comprises:

implanting hydrogen ions into the second part from a top surface of the photoresist layer, wherein an implantation depth of the hydrogen ions is a first depth, the first depth is equal to a thickness of the second part, the second part becomes the third part after the hydrogen ions are implanted into the second part, and the third part has a higher concentration of hydrogen ions than the first part positioned below the third part.

5. The method of processing a photoresist layer according to claim 4, wherein the third part has the concentration of hydrogen ions more than twice that of the first part.

6. The method of processing a photoresist layer according to claim 1, wherein the processing the second part of the photoresist layer by using a first process comprises:

spraying an acid gas on the second part from a top surface of the photoresist layer, wherein the second part becomes the third part after the second part is sprayed with the acid gas, and the third part has a higher concentration of the photo-acid generator than the first part positioned below the third part.

7. The method of processing a photoresist layer according to claim 6, wherein the acid gas is hydrogen chloride gas or hydrofluoric acid gas.

8. The method of processing a photoresist layer according to claim 1, wherein a refractive index of the second part is greater than a refractive index of the first medium and less than a refractive index of the first part.

9. The method of processing a photoresist layer according to claim 1, wherein the first exposure processing is performed in an exposure apparatus, and the performing first exposure processing on the photoresist layer further comprises:

adjusting the exposure apparatus, such that a focal plane for imaging of the exposure apparatus is located in the first part.

10. The method of processing a photoresist layer according to claim 9, wherein the focal plane for imaging of the exposure apparatus is formed in a plane in which a central line of the first part is located, and the first part is located between a front focal depth and a back focal depth for imaging of the exposure apparatus.

11. The method of processing a photoresist layer according to claim 10, wherein the front focal depth is half of a thickness of the first part.

12. The method of processing a photoresist layer according to claim 1, further comprising:

providing a mask plate, wherein a mask pattern is formed on the mask plate; and performing the first exposure processing on the photoresist layer based on the mask plate.

13. The method of processing a photoresist layer according to claim 1, wherein the forming a photoresist layer on a target layer comprises:

coating the target layer with a photoresist solution comprising a photo-acid generator, a polymer resin, and an organic solvent, pre-baking the target layer coated with photoresist solution at a temperature of 80° C. to 110° C. for 50 seconds to 80 seconds.

14. The method of processing a photoresist layer according to claim 1, further comprising:

post-baking the first part after the second development processing at a temperature of 130° C. to 200° C. for 20 minutes to 40 minutes.

15. The method of processing a photoresist layer according to claim 1, wherein a concentration of a first developing solution used in the first development processing is lower than a concentration of a second developing solution used in the second development processing.

16. The method of processing a photoresist layer according to claim 1, wherein a metal oxide or light absorbing groups is added to the second part.

17. The method of processing a photoresist layer according to claim 1, wherein a value of a thickness of the second part is greater than $\frac{1}{10}$ of a value of the first wavelength of the first incident beam.

18. The method of processing a photoresist layer according to claim 17, wherein KrF lithography equipment is used, the thickness of the second part is greater than 24.8 nm; or ArF lithography equipment is used, the thickness of the second part is greater than 19.3 nm; or EUV lithography equipment is used, the thickness of the second part is greater than 1.35 nm.

19. A method of processing a photoresist layer, comprising:

forming a photoresist layer on a target layer, wherein the photoresist layer comprises a first part on the target layer and a second part on the first part, wherein the target layer is a substrate or material layer;

performing first exposure processing on the photoresist layer, and the first part of the photoresist layer on the target layer having an exposure image;

processing the second part of the photoresist layer by using a first process, such that the second part becomes a third part, wherein a photosensitivity of the third part is higher than a photosensitivity of the first part;

performing first development processing to develop the third part to strip the third part on the first part;

performing second development processing to develop the first part with the exposure image; and further comprising:

post-baking the first part after the second development processing at a temperature of 130° C. to 200° C. for 20 minutes to 40 minutes.

20. A method of processing a photoresist layer, comprising:

forming a photoresist layer on a target layer, wherein the photoresist layer comprises a first part on the target layer and a second part on the first part, wherein the target layer is a substrate or material layer;

performing first exposure processing on the photoresist layer, and the first part of the photoresist layer on the target layer having an exposure image;

processing the second part of the photoresist layer by using a first process, such that the second part becomes a third part, wherein a photosensitivity of the third part is higher than a photosensitivity of the first part;

performing first development processing to develop the third part to strip the third part on the first part; and performing second development processing to develop the first part with the exposure image;

wherein a concentration of a first developing solution used in the first development processing is lower than a concentration of a second developing solution used in the second development processing.

* * * * *